(12) United States Patent
Li et al.

(10) Patent No.: US 10,636,337 B2
(45) Date of Patent: Apr. 28, 2020

(54) ELECTRONIC DEVICE AND CASE

(71) Applicants: Ching-Hua Li, Taipei (TW);
Chen-Hsien Cheng, Taipei (TW);
Li-Fang Chen, Taipei (TW)

(72) Inventors: Ching-Hua Li, Taipei (TW);
Chen-Hsien Cheng, Taipei (TW);
Li-Fang Chen, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 0 days.

(21) Appl. No.: 15/987,913

(22) Filed: May 24, 2018

(65) Prior Publication Data
US 2018/0359872 A1 Dec. 13, 2018

Related U.S. Application Data

(60) Provisional application No. 62/510,731, filed on May 24, 2017.

(51) Int. Cl.
*G09G 3/00* (2006.01)
*G06F 3/01* (2006.01)
(Continued)

(52) U.S. Cl.
CPC .............. *G09G 3/002* (2013.01); *G03B 17/54* (2013.01); *G03B 21/10* (2013.01); *G03B 21/142* (2013.01);
(Continued)

(58) Field of Classification Search
CPC ... F16M 11/06; A47B 97/00; A47B 2097/006; A47B 2097/005; H05K 5/0234; H05K 5/0247; H05K 5/0017; H05K 5/0217
See application file for complete search history.

(56) References Cited

U.S. PATENT DOCUMENTS

7,854,422 B2 * 12/2010 Kameoka ............... F16M 11/08
 248/349.1
8,094,244 B2 * 1/2012 Sawai ...................... F16M 11/10
 248/919

(Continued)

FOREIGN PATENT DOCUMENTS

CN 102087538 6/2011
CN 102087538 10/2014

OTHER PUBLICATIONS

"Office Action of Taiwan Counterpart Application", dated Jan. 7, 2019, p. 1-p. 8.

*Primary Examiner* — Jayprakash N Gandhi
*Assistant Examiner* — Hung Q Dang
(74) *Attorney, Agent, or Firm* — JCIPRNET

(57) ABSTRACT

The disclosure discloses an electronic device, which comprises a case and at least one display module. The case comprises a base, a housing, two connection ports and a track. The housing is disposed above the base and has an opening. The two connection ports are disposed in the housing and corresponding to the opening. The track is disposed on the edge of the base, and at least one end of the track is adjacent to the opening. At least one display module is disposed on the case and electrically connected to a corresponding one of the two connection ports and is adapted to slide on the track to generate a displacement in relative to the case. The disclosure also discloses a case which is adapted to be connected to at least one display module in the electronic device.

23 Claims, 12 Drawing Sheets

(51) Int. Cl.
   *G03B 21/14* (2006.01)
   *G03B 21/28* (2006.01)
   *H04N 9/31* (2006.01)
   *G03B 21/10* (2006.01)
   *G03B 17/54* (2006.01)
   *H05K 5/00* (2006.01)
   *H05K 5/02* (2006.01)
   H04N 13/398 (2018.01)
   H04N 13/363 (2018.01)

(52) U.S. Cl.
   CPC ............ *G03B 21/28* (2013.01); *G06F 3/013* (2013.01); *G09G 3/001* (2013.01); *H04N 9/3179* (2013.01); *H04N 9/3194* (2013.01); *H05K 5/0017* (2013.01); *H05K 5/0217* (2013.01); *H05K 5/0234* (2013.01); *G03B 21/145* (2013.01); *G06F 3/017* (2013.01); *G09G 3/003* (2013.01); *H04N 13/363* (2018.05); *H04N 13/398* (2018.05)

(56) References Cited

U.S. PATENT DOCUMENTS

| | | | |
|---|---|---|---|
| 9,357,846 B2 | 6/2016 | Hung | |
| 2005/0194509 A1* | 9/2005 | Tsai | A47B 49/00 248/349.1 |
| 2007/0221810 A1* | 9/2007 | Liao | F16M 11/08 248/425 |
| 2017/0051865 A1* | 2/2017 | Chen | F16M 11/041 |

* cited by examiner

ELECTRONIC DEVICE AND CASE

CROSS-REFERENCE TO RELATED APPLICATION

This application claims the priority benefit of U.S. provisional application Ser. No. 62/510,731, filed on May 24, 2017. The entirety of the above-mentioned patent application is hereby incorporated by reference herein and made a part of this specification.

BACKGROUND OF THE DISCLOSURE

1. Field of the Disclosure

The disclosure relates to an electronic device and a case.

2. Description of Related Art

Most of the existing electronic devices, such as the desktop case, can be connected to a display module through a slot provided on the case. As the needs of users become more and more diverse, some electronic devices will have expansion slots on the case for connection to another display module. However, by providing an expansion slot on the case to expand the connection to another display module, the connecting lines required for the connection (for example, transmission lines or power lines) occupy the surrounding environment of the case, which is not favorable for the use of the case. In addition, the expanded another display module is connected to the expansion slot of the case through a line such as a connecting line, resulting in that the display module is limited to the position of the expansion slot and is in a fixed operating mode, which is not favorable for the operation of the electronic device.

SUMMARY

The electronic device of the disclosure comprises a case and at least one display module. The case comprises a base, a housing, two connection ports and a track. The housing is disposed above the base and has an opening. The two connection ports are disposed in the housing and corresponding to the opening. The track is disposed on the edge of the base, and at least one end of the track is adjacent to the opening. At least one display module is disposed on the case and electrically connected to a corresponding one of the two connection ports. The display module comprises a display screen, a bracket and a guide portion. The bracket has a first end and a second end opposite to each other. The display screen is disposed on the first end. The guide portion is disposed on the second end of the bracket. The bracket is connected to the base with the second end corresponding to the opening, and the guide portion is slidably mounted on the track. The at least one display module is adapted to slide on the track through the guide portion to generate a displacement in relative to the case.

The case of the disclosure comprises a base, a housing, two connection ports and a track. The housing is disposed above the base and has an opening. The two connection ports are disposed in the housing and corresponding to the opening. The track is disposed on the edge of the base, and at least one end of the track is adjacent to the opening. Wherein at least one display module is adapted to be disposed on the case and electrically connected to a corresponding one of the two connection ports and slide on the track to generate a displacement in relative to the case.

DESCRIPTION OF THE EMBODIMENTS

Figure 1:
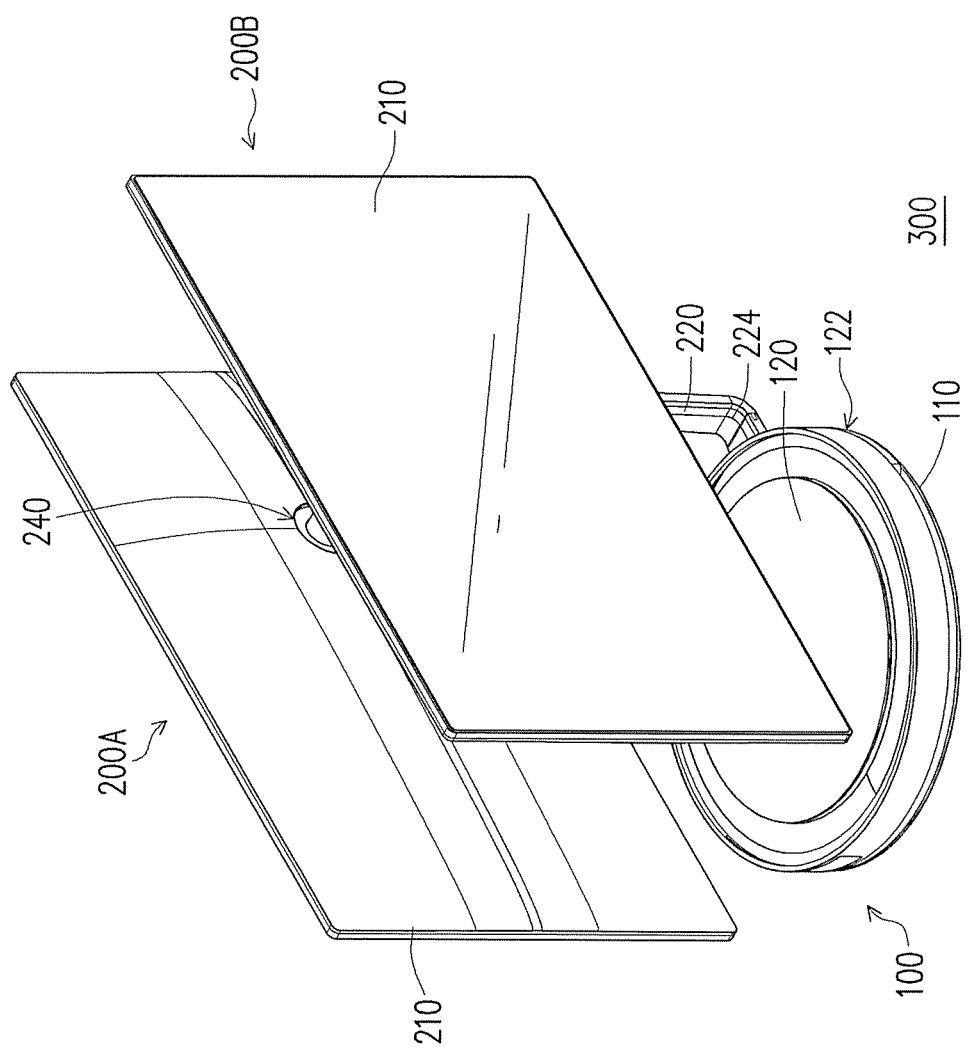
FIG. 1 is a perspective view of an electronic device according to an embodiment of the disclosure.

The disclosure provides an electronic device having various and convenient operating modes.

The disclosure provides a case having various and convenient operating modes.

In an embodiment of the disclosure, wherein the track is an arc-shaped track. The at least one display module slides on the arc-shaped track through the guide portion to generate a rotational displacement in relative to the case.

In an embodiment of the disclosure, wherein the guide portion is in an arc shape, the cross section of the guide portion is in a cap shape and is slidably mounted on the track in a manner of covering the track.

In an embodiment of the disclosure, wherein the bracket is detachably assembled to the guide portion through the second end.

In an embodiment of the disclosure, wherein a surface on the track corresponding to the guide portion of the at least one display module is a wear-resistant surface. The guide portion contacts the wear-resistant surface, so as to slide on the track.

In an embodiment of the disclosure, wherein a surface on the guide portion corresponding to the track a wear-resistant surface. The wear-resistant surface of the guide portion contacts the track, so as to slide on the track.

In an embodiment of the disclosure, wherein a surface on the track corresponding to the guide portion of the at least one display module is disposed with a plurality of rolling components in convex and side by side. The guide portion contacts the rolling components, so as to slide on the track.

In an embodiment of the disclosure, wherein a surface on the guide portion corresponding to the track is disposed with a plurality of rolling components in convex and side by side. The guide portion contacts the track through the rolling components, so as to slide on the track.

In an embodiment of the disclosure, wherein the second end of the bracket is disposed with a plurality of rolling components in convex and side by side. The guide portion of the at least one display module contacts the track and contacts a working plane where the case is located through the rolling components, so as to slide on the track.

In an embodiment of the disclosure, wherein an inner side of the base adjacent to the track is disposed with a plurality of rolling components side by side. The guide portion of the at least one display module contacts the track and contacts the rolling components, so as to slide on the track.

In an embodiment of the disclosure, wherein the number of the at least one display module is two, the two display modules are respectively connected to the base through the corresponding bracket with the second end corresponding to the opening, respectively electrically connected to a corresponding one of the two connection ports and respectively mounted on the track through the corresponding guide portion. At least one of the display modules is adapted to slide on the track through the corresponding guide portion to generate a displacement in relative to the case.

In an embodiment of the disclosure, wherein at least one of the display modules is fixed to a fixed position on the base.

In an embodiment of the disclosure, wherein at least one of the display modules is detachably assembled to the case.

In an embodiment of the disclosure, wherein at least one of the display modules slides on the track through the corresponding guide portion to generate a displacement in relative to the case, so that the display modules are in an operating mode of being back to each other, parallel to each other or perpendicular to each other.

In an embodiment of the disclosure, wherein the at least one display module comprises a pivoting structure disposed between the first end of the bracket and the display screen. The at least one display module is adapted to rotate in relative to the bracket and the case through the pivoting structure.

In an embodiment of the disclosure, wherein the pivoting structure has a rotating shaft and a rotary disk connected with each other. The rotating shaft extends along a long side direction of the display screen so that the display screen is adapted to flip in relative to the case through the rotating shaft by using the long side direction as the axis. The rotary disk is used to rotate in relative to the bracket along a perpendicular direction of the display screen so that the display screen is adapted to rotate in relative to the case through the rotary disk by using the perpendicular direction as the axis, and the perpendicular direction is perpendicular to the long side direction.

In an embodiment of the disclosure, wherein the pivoting structure has a rotating shaft and a rotary disk connected with each other. The rotating shaft extends along a short side direction of the display screen so that the display screen is adapted to flip in relative to the case through the rotating shaft by using the short side direction as the axis.

In an embodiment of the disclosure, wherein the display screen has two opposite short sides and two opposite long sides. The pivoting structure is disposed at a position at one third of the length of the long side from one of the two short sides and one half of the length of the short side from one of the two long sides in the display screen.

In an embodiment of the disclosure, wherein the at least one display module has at least one docking port disposed on at least one edge of the display screen.

Based on the above, the electronic device of the disclosure comprises a case and at least one display module, wherein the case is disposed with two connection ports and a track, and the at least one display module is adapted to be disposed on the case and electrically connected to a corresponding one of the two connection ports and slide on the track to generate a displacement in relative to the case. That is, the electronic device and the case of the disclosure can be configured with one or two display modules according to demands through the two connection ports, and the display module can adjust the operating mode according to demands by sliding on the track. Thus, the electronic device and the case of the disclosure has various and convenient operating modes.

In order to make the aforementioned and other objectives and advantages of the disclosure comprehensible, embodiments accompanied with figures are described in detail below.

Figure 2:
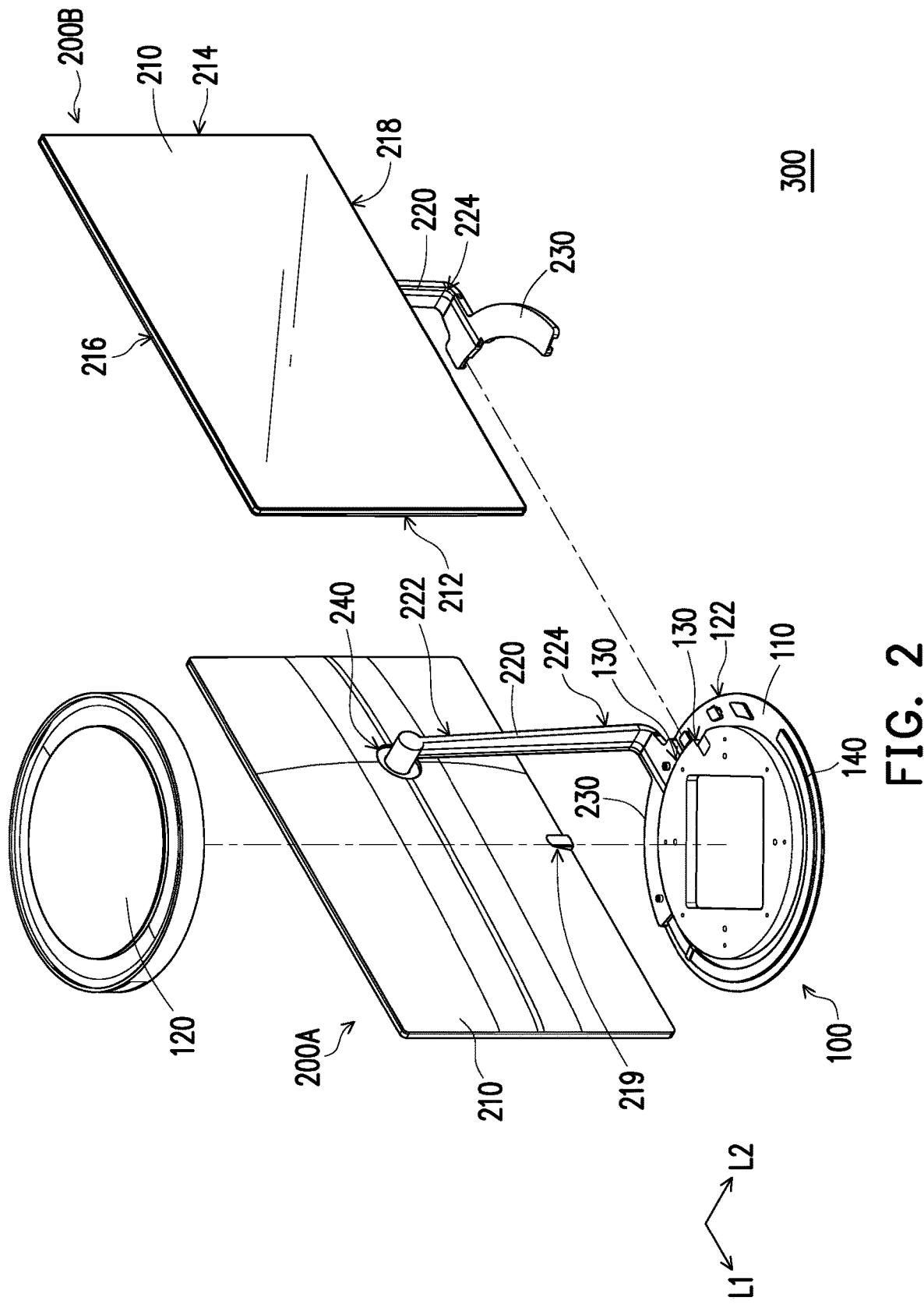
FIG. 2 is a partial exploded view of the electronic device of FIG. 1.

FIG. 1 is a perspective view of an electronic device according to an embodiment of the disclosure. FIG. 2 is a partial exploded view of the electronic device of FIG. 1. Referring to FIG. 1 to FIG. 2, in the present embodiment, the electronic device 300 comprises a case 100 and display modules 200A and 200B. The case 100 comprises a base 110, a housing 120, two connection ports 130 and a track 140. The base 110 is, for example, a circular chassis. The housing 120 is, for example, a flat circular housing, is disposed above the base 110 and has an opening 122. Furthermore, the opening 122 may be formed by a gap between the edge of the housing 120 and the edge of the base 110, so as to lower the influence of the opening 122 on the appearance of the case 100, but is not limited thereto. An electronic component (not depicted) required by the case 100, such as a central processing unit (CPU), a memory, a mainboard, a connector and the like, is disposed on the base 110 and located in the housing 120, but the composition thereof is not limited. The two connection ports 130 are disposed in the housing 120, corresponding to the opening 122 and electrically connected to the electronic component (for example, the mainboard). Furthermore, the two connection ports 130 are, for example, Type-C USB receptacle connectors, but are not limited thereto. In addition, the track 140 is disposed on the edge of the base 110, and at least one end of the track 140 is adjacent to the opening 122. Thus, the electronic device 300 is adapted to be disposed with the two display modules 200A and 200B, but it is also possible to mount only one of the display modules 200A and 200B according to demands. Besides, the electronic device 300 is adapted for adjusting the position of at least one of the display modules 200A and 200B through the track 140, so as to adjust the operating mode of the electronic device 300.

In the present embodiment, the display modules 200A and 200B have similar configurations, but the technical features described later can also be used only for one of the display modules 200A and 200B, or the display modules 200A and 200B respectively adopt partial technical features, and the disclosure is not limited thereto.

In detail, the display modules 200A and 200B are respectively disposed on the case 100 and correspondingly electrically connected to a corresponding one of the two connection ports 130 (the display module 200A of FIG. 2 is already in a state of being connected to the corresponding one of the two connection ports 130). The display modules 200A and 200B respectively comprise a display screen 210, a bracket 220 and a guide portion 230. The bracket 220 has a first end 222 and a second end 224 opposite to each other. The display screen 210 is disposed on the first end 222 of the bracket 220, and the guide portion 230 is disposed on the second end 224 of the bracket 220. The bracket 220 is connected to the base 110 with the second end 224 corresponding to the opening 122, and the guide portion 230 is slidably mounted on the track 140, so as to generate a displacement in relative to the case 100 by sliding on the track 140. Furthermore, the display modules 200A and 200B are respectively disposed with an undepicted connector, for example, disposed on the second end 224 of the bracket 220, and are adapted to be electrically connected to the corresponding one of the two connection ports 130 through the corresponding connector, so as to be electrically connected to the undepicted electronic component (for example, the mainboard) in the case 100. Thus, the connector is preferably a Type-C USB plug connector, but is not limited thereto. Besides, connectors and connecting lines (such as signal lines) in the display modules 200A and 200B required by the electrical connection to the case 100 may be further integrated into the bracket 220, so as to keep the electronic device 300 simple and beautiful, but the disclosure is not limited thereto.

Figure 3:
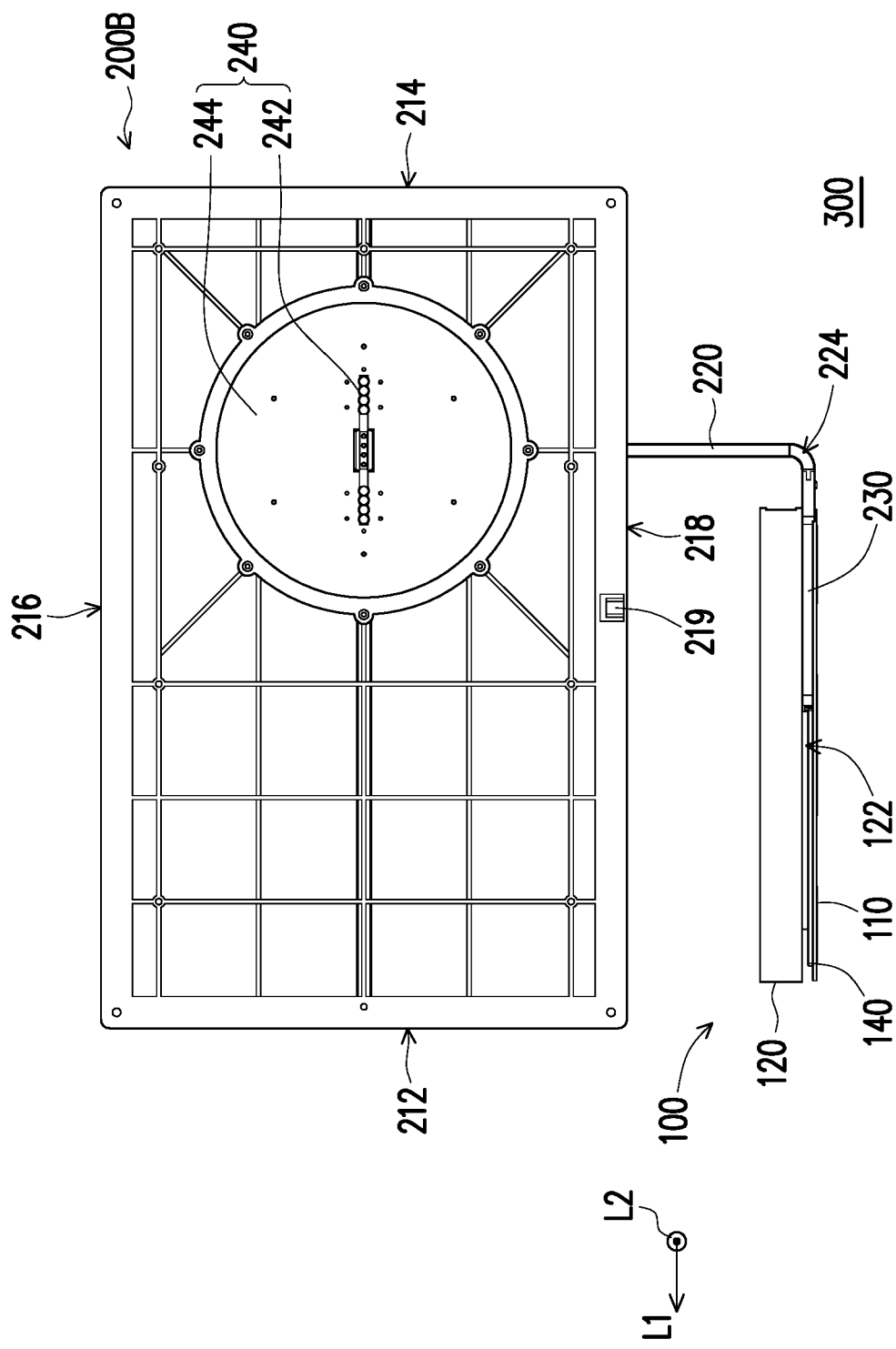
FIG. 3 is a partial side view of the electronic device of FIG. 1.

FIG. 3 is a partial side view of the electronic device of FIG. 1. Referring to FIG. 2 to FIG. 3, in the present embodiment, the display modules 200A and 200B respectively comprise a pivoting structure 240 disposed between the first end 222 of the bracket 220 and the display screen 210. The display modules 200A and 200B are adapted to rotate in relative to the bracket 220 and the case 100 respectively through the pivoting structure 240. Wherein FIG. 3 shows an internal structure of the pivoting structure 240 by omitting the display surface of the display screen 210 of the display device 200B. Furthermore, the pivoting structure 240 has a rotating shaft 242 and a rotary disk 244 connected with each other. The rotating shaft 242 extends along a long side direction L1 (i.e., the left-and-right direction of FIG. 3) of the display screen 210 so that the display screen 210 is adapted to flip back and forth in relative to the case 100 through the rotating shaft 242 by using the long side direction L1 as the axis, thereby adjusting the viewing angle of the display screen 210. Besides, the rotary disk 244 is used to rotate in relative to the bracket 220 along the perpendicular direction L2 of the display screen 210 so that the display screen 210 rotates up and down in relative to the case 100 through the rotary disk 244 by using the perpendicular direction L2 (the picture plane direction of FIG. 3) as the axis, thereby adjusting the viewing direction (horizontal or vertical direction) of the display screen 210. Wherein the perpendicular direction L2 is perpendicular to the long side direction L1. However, in other undepicted embodiments, the pivoting structure may also be designed as that the rotating shaft extends along the short side direction of the display screen (i.e., the up-and-down direction of FIG. 3), so that the display screen is adapted to flip left and right in relative to the case through the rotating shaft by using the short side direction as the axis. The disclosure does not limit the implementation of the pivoting structure and can be adjusted according to demands.

Referring to FIG. 3, furthermore, in the present embodiment, the display screen 210 has two opposite short sides 212 and 214 and two opposite long sides 216 and 218. The pivoting structure 240 is disposed at a position at one third of the length of the long side from one of the two short sides 212 and 214 (for example, the short side 214) and one half of the length of the short side from one of the two long sides 216 and 218 (for example, the long side 216 or long side 218) in the display screen 210. In other words, the pivoting structure 240 is not disposed at the center of the display screen 210, but is biased to the short side 214 on one side. Thus, the display modules 200A and 200B may not be limited to the length of the bracket 220 (i.e., the height of the display screen 210), so that the display screen 210 can freely generate a displacement (as detailed in the operating modes described later).

Figure 4:
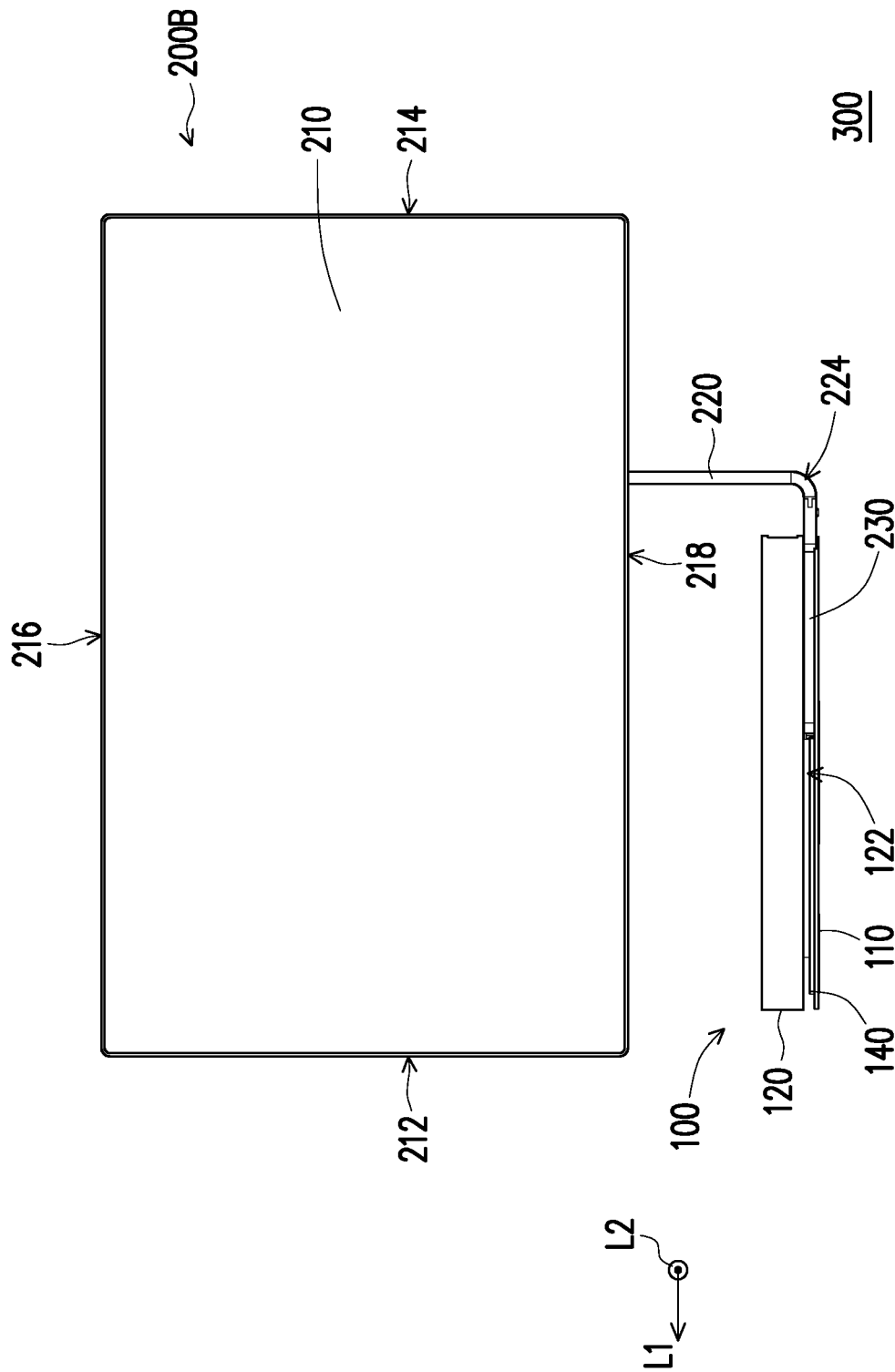
FIG. 4 and FIG. 5 are operation diagrams of the electronic device of FIG. 3.
Figure 5:
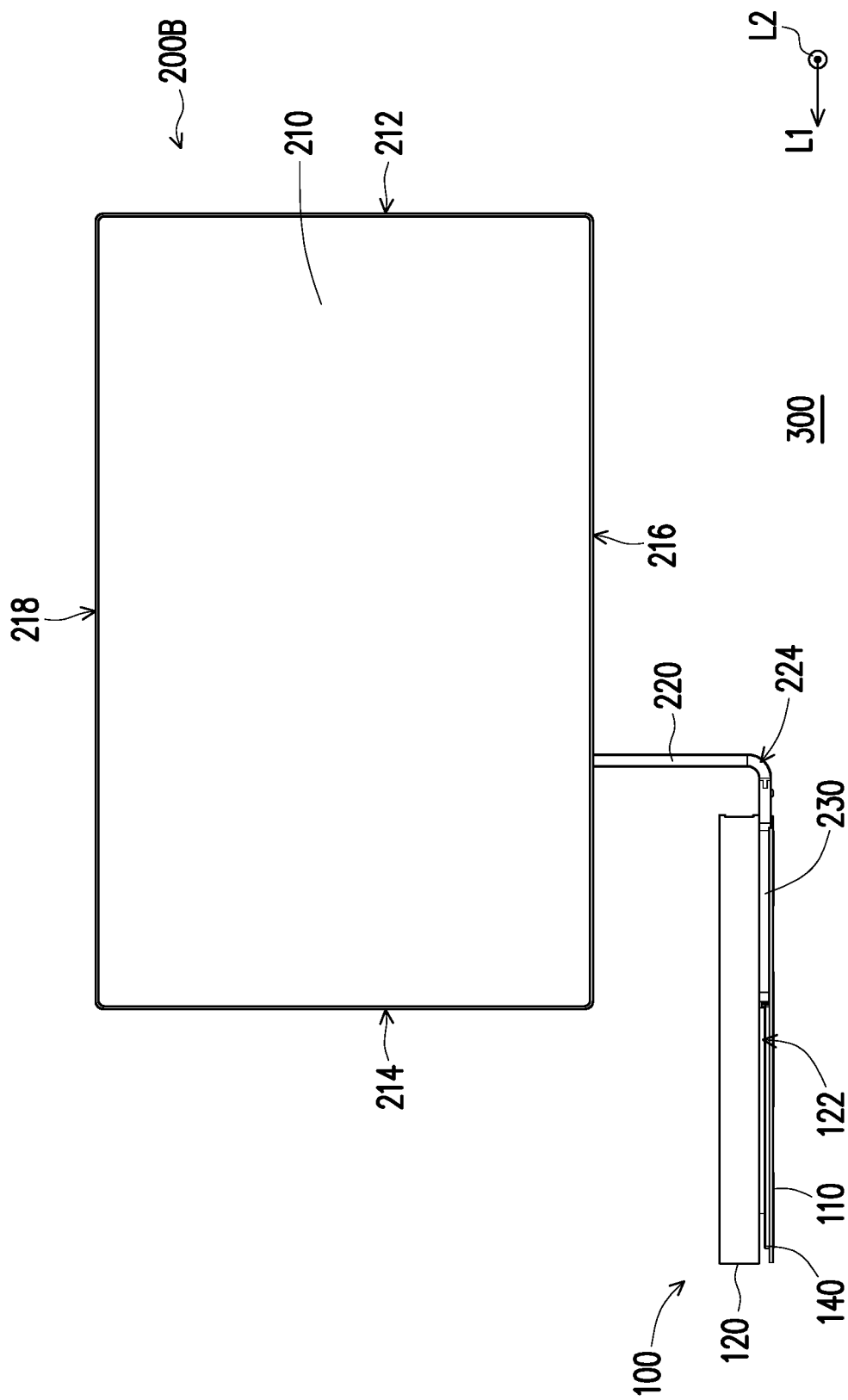
Figure 6:
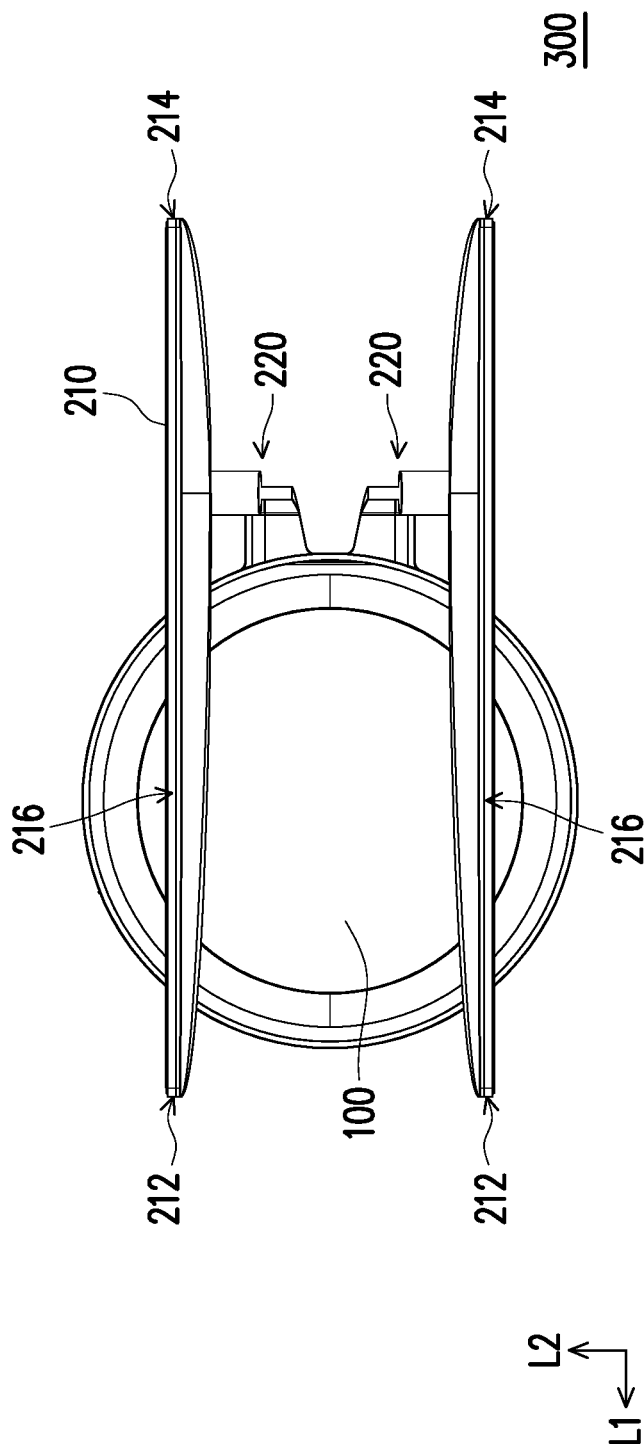
FIG. 6 and FIG. 7 are operation diagrams of the electronic device of FIG. 4 and FIG. 5 from another viewing angle.
Figure 7:
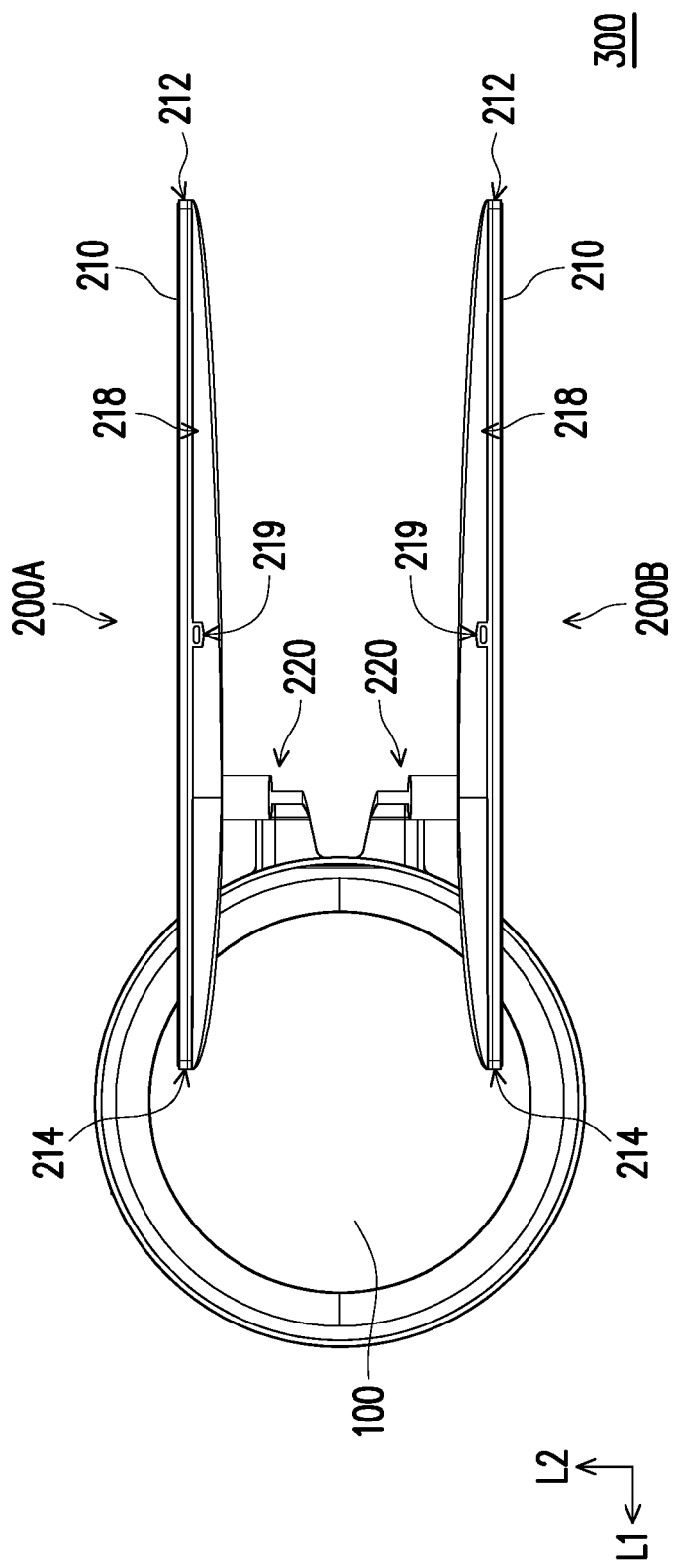

FIG. 4 and FIG. 5 are operation diagrams of the electronic device of FIG. 3. FIG. 6 and FIG. 7 are operation diagrams of the electronic device of FIG. 4 and FIG. 5 from another viewing angle. Referring to FIG. 3 to FIG. 7, after the display modules 200A and 200B rotate in relative to the case 100 through the rotary disk 244 in the pivoting structure 240, an operating mode as shown in FIG. 4 and FIG. 6, an operating mode as shown in FIG. 5 and FIG. 7, or an operating mode in between can be obtained. Furthermore, taking the display module 200B as an example, when the display module 200B is in the operating mode of FIG. 4 and FIG. 6, the short side 212 of the display screen 210 is located on the left side, the short side 214 is located on the right side, the long side 216 is located on the upper side, and the long side 218 is located on the lower side. When the display module 200B rotates in relative to the case 100 through the pivoting structure 240 and the operating mode of FIG. 4 and FIG. 6 is changed into the operating mode of FIG. 5 and FIG. 7, the short side 212 of the display screen 210 is located on the right side, the short side 214 is located on the left side, the long side 216 is located on the lower side, and the long side 218 is located on the upper side. In the state not depicted, when the display module 200B rotates in relative to the case 100 through the pivoting structure 240 and is changed to the operating mode between the operating mode of FIG. 4 and FIG. 6 and the operating mode of FIG. 5 and FIG. 7, the short side 212 of the display screen 210 is located on the upper side, the short side 214 is located on the lower side, the long side 216 is located on the right side, and the long side 218 is located on the left side. The terms "left side", "right side", "upper side" and "lower side" described above are used to explain the corresponding drawings of the present embodiment, and are not intended to limit the disclosure.

Thereby, the display screen 210 of the display modules 200A and 200B may rotate by 90 degrees according to demands to change the long side on the upper side into the short side on the upper side (vice versa), or rotate by 180 degrees to change one long side on the upper side into the other long side on the upper side, thereby adjusting the position of the display screen 210. Besides, the pivoting structure 240 may also be disposed with undepicted fixed sticking points, so that the display modules 200A and 200B can be fixed by the corresponding fixed sticking point when rotating to the required position in relative to the case 100 through the pivoting structure 240, and the operating modes and positions of the display modules 200A and 200B can be determined according to the fixed sticking points. In addition, the display modules 200A and 200B may rotate through the corresponding pivoting structure 240 to be adjusted to the same operating mode, and may also rotate through the corresponding pivoting structure 240 to be adjusted to different operating modes (for example, one of the display modules 200A and 200B has the long side on the upper side, and the other one has the short side on the upper side). Alternatively, only one of the display modules 200A and 200B may be disposed with the pivoting structure 240, and the disclosure does not limit the number, composition and disposition of the pivoting structures 240.

Furthermore, since the pivoting structure 240 is not disposed at the center of the display screen 210 but in the position nearer to the short side 214 on the display screen 210, the display screen 210 rotated 180 degrees through the pivot structure 240, that is, the state of FIG. 4 and FIG. 6 with respect to FIG. 5 and FIG. 7, has a long side on the upper side, but actually has a difference in operation.

In detail, when the display screen 210 of the display modules 200A and 200B has at least one docking port 219 disposed on at least one edge (for example, the long side 218) of the display screen 210, the position of the docking port 219 may also be changed by adjusting the operating mode of the display screen 210. For example, when the long side 218 and the docking port 219 are both adjusted to be on the upper side of the display screen 210, the docking port 219 can be used to connect an undepicted image input device (for example, a video camera) suspended on the long side 218; and when the long side 218 and the docking port 219 are both adjusted to be on the lower side or the left side of the display screen 210, the docking port 219 can be used to connect an undepicted expansion device (such as a keyboard, a mouse, or an external hard disk). In addition, there may be multiple docking ports 219, which are collectively disposed on the same edge of the display screen 210 or dispersed on different edges of the display screen 210. The disclosure does not limit the number, position, and disposition of the docking ports 219, which can be adjusted according to the selection.

Alternatively, on the premise that the display screen 210 is adjusted to the position with the short side 214 on the inner side (i.e., the operating mode of FIG. 5 and FIG. 7), the center of the display screen 210 is located on the outer side of the case 100 and the bracket 220, i.e., the major part of the display screen 210 is located on the outer side of the case 100 and the bracket 220. Thus, when at least one of the display modules 200A and 200B generates a displacement in relative to the case 100, under the condition that the displacement range of the bracket 220 in relative to the case 100 is preset, since the major part of the display screen 210 is located on the outer side of the case 100 and the bracket 220, the display modules 200A and 200B may not interfere with each other (as the operating mode described later in FIG. 8), but the disclosure is not limited thereto.

On the other hand, in addition to that the display modules 200A and 200B can adjust the operating mode of the display screen 210 according to the above-mentioned manner, and it is also possible to adjust the relative positions of the display modules 200A and 200B through the aforementioned guide portion 230 and track 140, for example, at least one of the display modules 200A and 200B generates a displacement in relative to the case 100, preferably generates a rotational displacement. Furthermore, the track 140 is an arc-shaped track, the guide portion 230 is in a cap shape, and the guide portion 230 and the track 140 have the same curvature radius, for example, adopting a circular arc. Thus, by the arc-shaped guide portion 230 sliding in relative to the arc-shaped as the track 140, at least one of the display modules 200A and 200B (for example, the display module 200B) may generate an arc-shaped rotational displacement in relative to the case 100, but the disclosure is not limited thereto. However, in other undepicted embodiments, when the case 100 adopt a square design, the track 140 may be a linear track, so that at least one of the display modules 200A and 200B generates a linear displacement in at least one linear direction in relative to the case 100; alternatively, when the case 100 adopts a circular design, a linear track may also be adopted as the track 140 to generate a linear displacement; alternatively, when the case 100 adopts a square design, the arc-shaped track of the present embodiment may also be adopted as the track 140 to generate a rotational displacement. Preferably, the shape of the track 140 is set along the shape of the edge of the base 110, but the disclosure is not limited thereto, and it can be adjusted according to demands.

Figure 8:
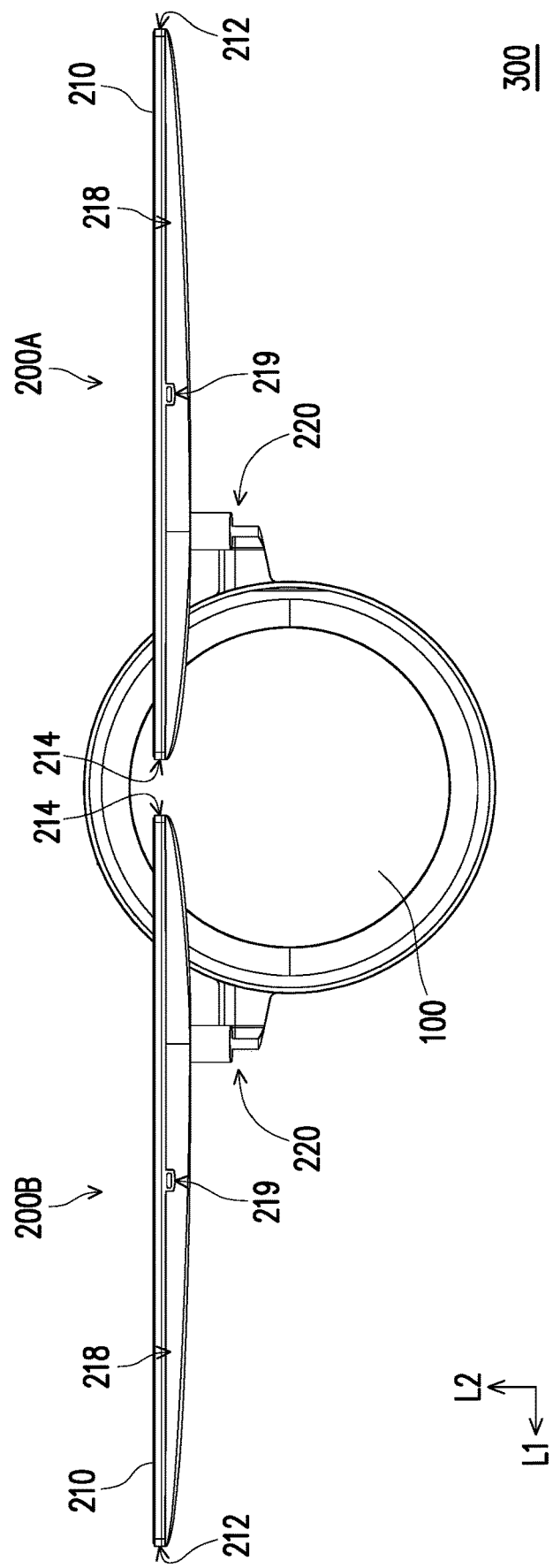
FIG. 8 is another operation diagram of the electronic device of FIG. 7.

FIG. 8 is another operation diagram of the electronic device of FIG. 7. Referring to FIG. 2, FIG. 7 and FIG. 8, in the present embodiment, one of the display modules 200A and 200B, for example the display module 200A, is fixed to the fixed position of the base 110, and the other one of the display modules 200A and 200B, for example the display module 200B, is disposed in a manner capable of generating a displacement in relative to the case 100. The said fixing may be fixing after the position adjustment, or may be already in a fixed state at the time of assembling. In other undepicted embodiments, when one of the display modules is in the fixed state, the display module in the fixed state may also omit the disposition of the corresponding guide portion and other structures for sliding and be directly fixed through the bracket to the track or the position of the base with no track. However, in other undepicted embodiments, the display modules 200A and 200B may also be set so that both of them can generate a displacement in relative to the base 110, but the disclosure is not limited thereto.

Thus, in the operating mode that the electronic device 300 is disposed with the display modules 200A and 200B, at least one of the display modules 200A and 200B (for example, the display module 200B) may slide on the track 140 through the corresponding guide portion 230 according to demands to generate a displacement in relative to the case 100, thereby adjusting the relative positions of the display modules 200A and 200B, for example, the display modules 200A and 200B are in an operating mode of being back to each other, parallel to each other or perpendicular to each other, i.e., the operating mode of FIG. 7, the operating mode of FIG. 8 or the operating mode between FIG. 7 and FIG. 8.

Furthermore, when the display modules 200A and 200B are in the operating mode of FIG. 7, the display surfaces of the display screens 210 of the display modules 200A and 200B respectively face different sides, presenting the operating mode of being disposed away from each other. When the display modules 200A and 200B are in the operating mode of FIG. 8, the display surfaces of the display screens 210 of the display modules 200A and 200B respectively face the same side, presenting the operating mode of being parallel to each other. When the display modules 200A and 200B are in the operating mode between FIG. 7 and FIG. 8, for example the display module 200B generates a displacement in relative to the case 100 to be perpendicular to the display module 200A, the display screens 210 of the display modules 200A and 200B are in the operating mode of being perpendicular to each other in a top view state. However, in other undepicted embodiments, the display modules 200A and 200B are not limited to the above-mentioned three operating modes. By providing at least one of the display modules 200A and 200B to be capable of generating a displacement, especially a rotational displacement, in relative to the case 100, the display modules 200A and 200B may be adjusted to any proper relative positions according to demands. Besides, the case 100 may also be disposed with undepicted fixed sticking points, so that at least one of the display modules 200A and 200B are fixed by the corresponding fixed sticking point when generating a displacement to the required position in relative to the case 100, and the operating modes and positions of the display modules 200A and 200B may be determined according to the fixed sticking point, but the disclosure is not limited thereto.

In addition, in the present embodiment, one of the display modules 200A and 200B, for example the display module 200A, is undetachably assembled to the case 100, and the other one of the display modules 200A and 200B, for example the display module 200B, is detachably assembled to the case 100. The "detachably assembled to the case 100" means that the bracket 220 and the guide portion 230 of the display module 200B are connected with each other, and the guide portion 230 is further disposed on the track 140 through the opening 122 with the second end 224 of the bracket 220 corresponding to the opening 122, so as to assemble the display module 200B to the case 100; and the bracket 220 and the guide portion 230 may be together detached from the case 100 via the opening 122 by reverse operation.

Alternatively, in other embodiments, the bracket 220 of the display module 200B is detachably assembled to the guide portion 230 through the second end 224, and the guide portion 230 is already disposed on the track 140 and located in the opening 122. Thus, with the second end 224 of the bracket 220 corresponding to the opening 122, the second end 224 is connected to the guide portion 230 which is already disposed on the base 110 through the opening 122, so that the display module 200B is assembled to the case 100; and the bracket 220 may also be detached from the guide portion 230 and the case 100 via the opening 122 by reverse operation. Thereby, the disclosure is not limited to the specific implementation of the "detachably assembled to the case 100", and may make adjustments according to demands. Besides, by providing one of the display modules 200A and 200B, for example the display module 200B, to be detachably assembled to the case 100, the electronic device 300 may be in the operating mode in which the display module 200A normally exists, and the display module 200B is further expanded in a detachable manner according to demands. However, in other undepicted embodiments, the display modules 200A and 200B may be both detachably assembled to the case 100, so as to be selectively mounted to the case 100 according to demands, and the disclosure is not limited thereto.

Thereby, in the present embodiment, the display modules 200A and 200B are respectively connected to the base 110 (detachably assembled or undetachably assembled) with the second end 224 of the corresponding bracket 220 corresponding to the opening 122, respectively connected to the corresponding one of the two connection ports 130 through the corresponding connector (not depicted) and respectively mounted on the track 140 (fixedly assembled or slidably assembled) through the corresponding guide portion 230, and at least one of the display modules 200A and 200B (for example display module 200B) is adapted to slide on the track 140 through the corresponding guide portion 230 to generate a displacement (for example a rotational displacement) in relative to the base 110. Besides, when the display modules 200A and 200B are both disposed to be capable of generating a displacement in relative to the base 110, the display modules 200A and 200B are adapted to respectively slide on the track 140 through the corresponding guide portion 230 to generate a displacement in relative to the case 100, thereby adjusting the relative positions of the display modules 200A and 200B.

Noted that in the present embodiment, the case 100 is disposed with the aforementioned electronic component (not depicted), such as the central processing unit, the memory, the mainboard, the connector or the like. Wherein the two connection ports 130 are electrically connected to the electronic component, so that the display modules 200A and 200B are connected to the corresponding connection ports 130 through the undepicted connectors, so as to be electrically connected to the case 100. Thus, under the condition that at least one of the display modules 200A and 200B is disposed to be adapted to generate a displacement in relative to the case 100, preferably, the electronic component (for example, a cable or flexible circuit board for connecting the connector of the display module 200B and the mainboard) connected with the display module (taking the display module 200B as an example) capable of generating a displacement should be provided with a reserved length and/or a reserved space in the surrounding environment thereof, so as to avoid the condition of a limited displacement range or an unexpected interference with the sliding of the guide portion 230 on the track 140 when the display module 200B generates a displacement in relative to the case 100. When the display modules 200A and 200B are both disposed to be capable of generating a displacement in relative to the case 100, the display modules 200A and 200B may both adopt the above-mentioned configuration manner, but the disclosure is not limited thereto.

Figure 9:
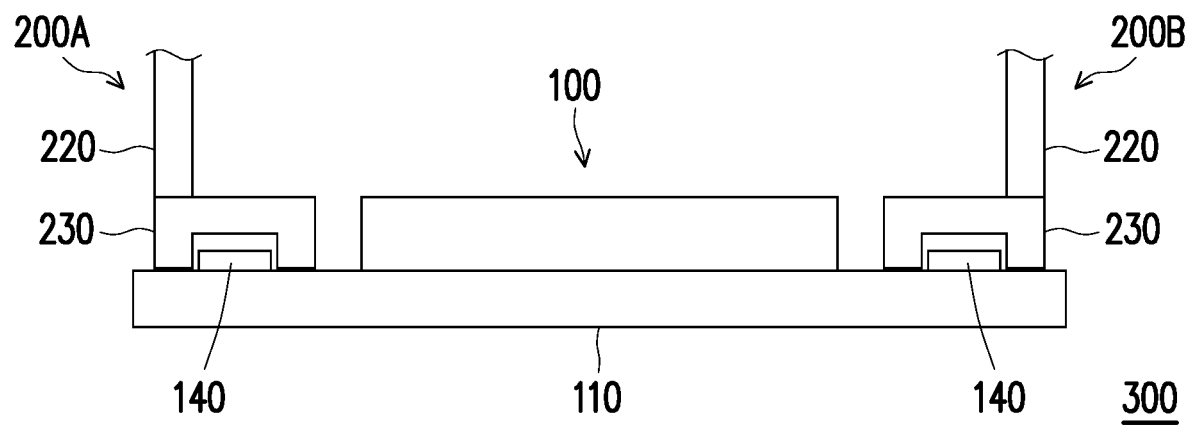
FIG. 9 is a partial diagram of the electronic device of FIG. 8.
Figure 10:
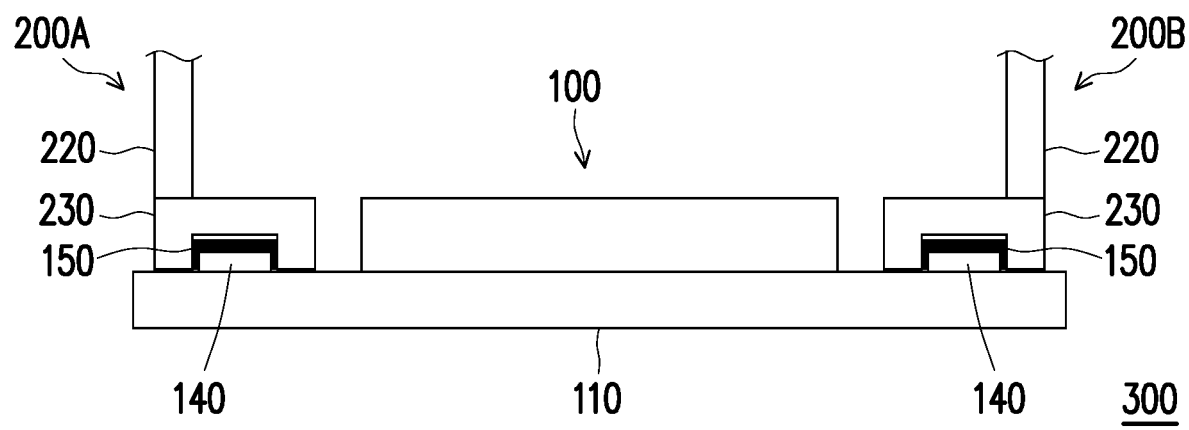
FIG. 10 to FIG. 14 are variations of the electronic device of FIG. 9.

FIG. 9 is a partial diagram of the electronic device of FIG. 8, wherein FIG. 9 omits depiction of the housing 120 and connection ports 130 of the case 100 and the display screens 210 of the display modules 200A and 200B, and the proportional relationship and relative positions between the components are adjusted properly (for example, the guide portion 230 and the track 140 are depicted as having a gap, but actually, the guide portion 230 and the track 140 may contact each other to achieve the purpose of guiding and limiting), so as to clearly present the relative relationship between the guide portion 230 and the track 140 but not to limit the disclosure (for example, there may actually be a gap between the guide portion 230 and the track 140, which can be adjusted according to demands).

In the present embodiment, the cross section of the guide portion 230 is in a cap shape, so as to be slidably mounted on the track 140 in a manner of covering the track 140. Wherein although the guide portions 230 of the display modules 200A and 200B are both depicted as covering the track 140 in FIG. 9, when one of the display modules 200A and 200B, for example the display module 200A, is set to be fixed to the base 110, the display module 200A may also omit the providing of the guide portion 230, so as to be directly fixed to the track 140 or the position of the base 110 with no track 140, but the disclosure is not limited thereto.

FIG. 10 to FIG. 14 are variations of the electronic device of FIG. 9. Firstly referring to FIG. 10, in the variation of FIG. 10, the surface on the track 140 corresponding to the guide portion 230 of the display modules 200A and 200B, i.e., the contact surface on the track 140 with the guide portion 230, is a wear-resistant surface, for example, is disposed with a wear-resistant layer 150. Thus, the guide portion 230 contacts the wear-resistant surface formed by the wear-resistant layer 150, so as to slide on the track 140. Alternatively, in other undepicted variations, the surface on the guide portion 230 corresponding to the track 140, i.e., the contact surface on the guide portion 230 with the track 140, may also be the wear-resistant layer 150/wear-resistant surface. Thus, the guide portion 230 contacts the track 140 with the wear-resistant surface formed by the wear-resistant layer 150, so as to slide on the track 140. In other words, the disposition of the wear-resistant layer 150/wear-resistant surface facilitates the sliding of the guide portion 230 on the track 140, and it is not limited to which of the two is disposed. Besides, although the positions on the track 140 depicted in FIG. 10 corresponding the guide portions 230 of the display modules 200A and 200B are respectively disposed with the wear-resistant layer 150/wear-resistant surface, when one of the display modules 200A and 200B, for example the display module 200A, is set to be fixed to the base 110, the position on the track 140 corresponding to the display module 200A may also omit the disposition of the wear-resistant layer 150/wear-resistant surface. Alternatively, when the display modules 200A and 200B are both disposed to be capable of generating a displacement, it is also possible that only one is disposed with the wear-resistant layer 150/wear-resistant surface, and the disclosure is not limited thereto.

Figure 11:
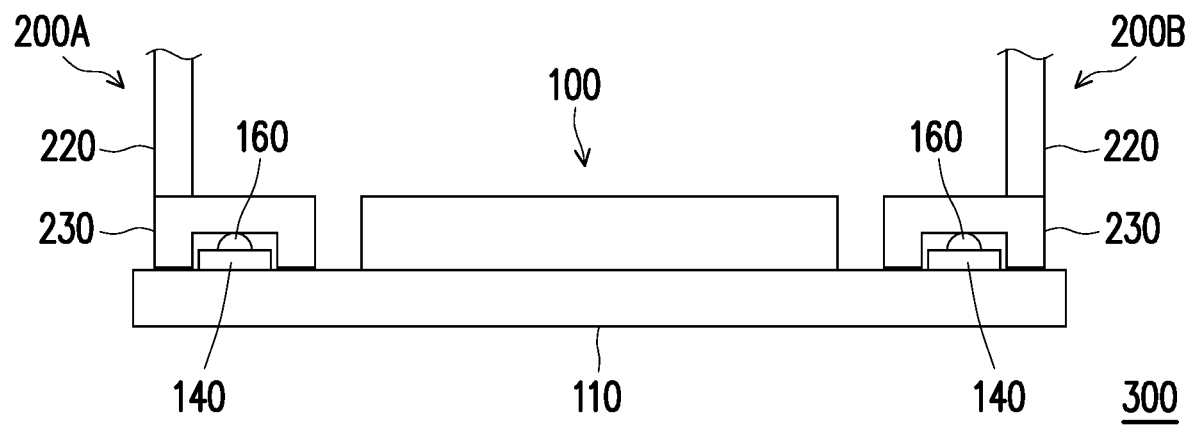
Figure 12:
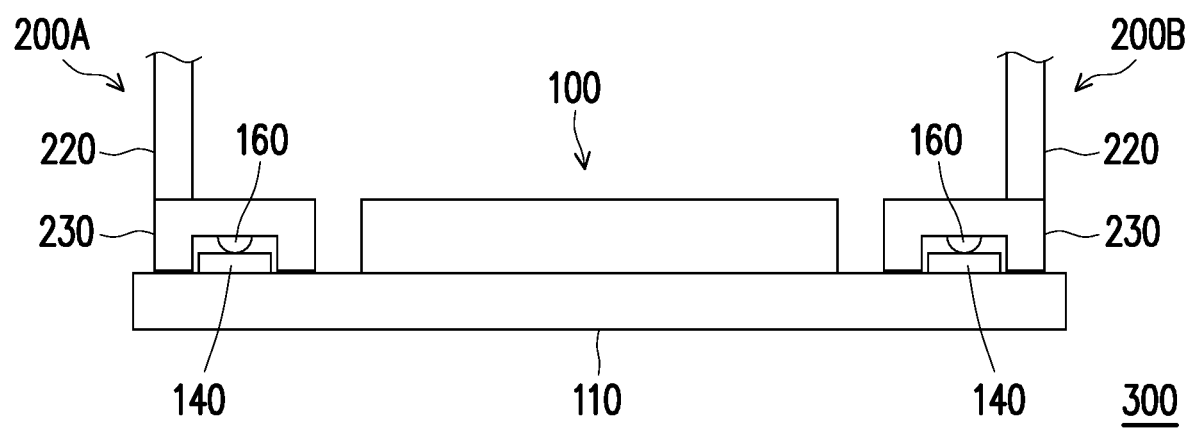

Referring to FIG. 11, in the variation of FIG. 11, the surface on the track 140 corresponding to the guide portions 230 of the display modules 200A and 200B, i.e., the contact surface on the track 140 with the guide portion 230, are disposed with a plurality of rolling components 160 in convex and side by side. Thus, the guide portion 230 contacts the rolling component 160, so as to slide on the track 140. However, referring to FIG. 12, in the variation of FIG. 12, the surface on the guide portion 230 corresponding to the track 140, i.e., the contact surface on the guide portion 230 with the track 140, are disposed with a plurality of rolling components 160 in convex and side by side. The rolling components 160 may be directly disposed on the guide portion 230, or detachably assembled to the guide portion 230 through an undepicted frame according to demands. Thus, the guide portion 230 contacts the track 140 through the rolling components 160, so as to slide on the track 140. In other words, the disposition of the rolling components 160 facilitates the sliding of the guide portion 230 on the track 140, and it is not limited to which of the two is disposed. In addition, although the rolling components 160 are depicted as rolling balls in FIG. 11 and FIG. 12, rolling bars or other rolling components may also be adopted. Besides, although the rolling components 160 are disposed between the guide portion 230 and the track 140 of the display modules 200A and 200B as depicted in both FIG. 11 and FIG. 12, when one of the display modules 200A and 200B, for example the display module 200A, is disposed to be fixed to the base 110, the disposition of the rolling components 160 between the display module 200A and the corresponding track 140 may also be omitted. Alternatively, when the display modules 200A and 200B are both disposed to be capable of generating a displacement, it is also possible that only one of them is disposed with the rolling components 160. In addition, although each guide portion 230 is corresponding to one rolling component 160 as depicted in FIG. 11 and FIG. 12, multiple rolling components 160 may be disposed actually. The disclosure does not limit the type, number, position and disposition of the rolling components 160.

Figure 13:
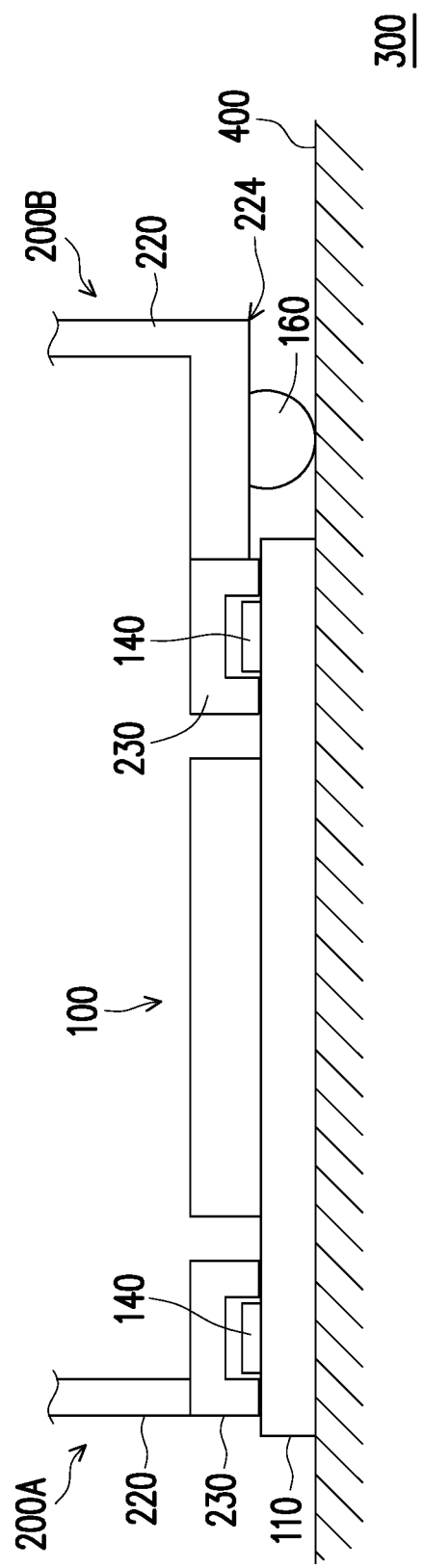

Referring to FIG. 13, in the variation of FIG. 13, in at least one of the display modules 200A and 200B, taking the display module 200B as an example, the second end 224 of the bracket 220 is disposed with a plurality of rolling components 160 in convex and side by side. The rolling components 160 may be directly disposed on the second end 224 of the bracket 220, or detachably assembled to the second end 224 of the bracket 220 through an undepicted frame according to demands. Thus, the guide portion 230 of the display module 200B contacts the track 140, and contacts the working place 400 (for example a tabletop) where the case 100 is located through the rolling components 160, so as to slide on the track 140. In other words, the disposition of the rolling components 160 facilitates the sliding the of the guide portion 230 on the track 140. In addition, although the rolling components 160 are depicted as rolling balls in FIG. 13, rolling bars or other rolling components may also be adopted. Besides, although the bracket 220 of the display module 200B is correspondingly disposed with the rolling components 160 as depicted in FIG. 13, when the display modules 200A and 200B are both disposed to be capable of generating a displacement, the brackets 220 of the display modules 200A and 200B may be both correspondingly disposed with the rolling components 160, or only the bracket 220 of the display module 200B is disposed with the rolling components 160. In addition, although the bracket 220 is corresponding to one rolling component 160 as depicted in FIG. 13, multiple rolling components 160 may be disposed actually, and the disclosure does not limit the type, number, position and disposition of the rolling components 160.

Figure 14:
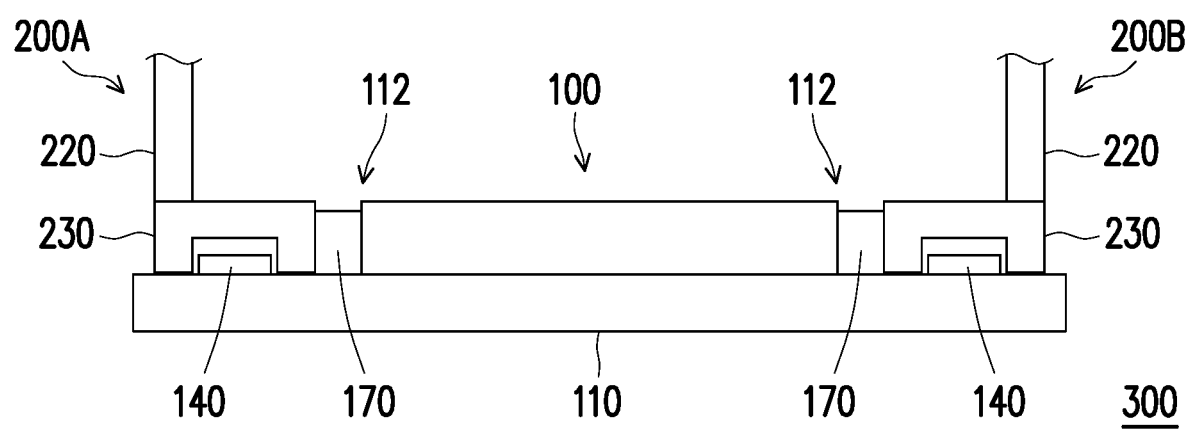

Referring to FIG. 14, in the variation of FIG. 14, the inner side 112 of the base 110 adjacent to the track 140, i.e., between the internal structure (for example, an inner housing accommodating the electronic component) of the base 110 and the track 140, is disposed with a plurality of rolling components 170 side by side. Thus, the guide portion 230 contacts the track 140 while also contacting the rolling components 170, so as to slide on the track 140. Alternatively, in other undepicted variations, the position on the guide portion 230 corresponding to the inner side 112 of the base 110 may also be disposed with a plurality of rolling components 170 side by side. The rolling components 170 may be directly disposed on the guide portion 230, or detachably assembled to the guide portion 230 through an undepicted frame according to demands. Thus, the guide portion 230 contacts the track 140 while also contacting the inner side 112 through the rolling components 170, so as to slide on the track 140. In other words, the disposition of the rolling components 170 facilitates the sliding of the guide portion 230 on the track 140, and it is not limited to which of the two is disposed. In addition, although the rolling components 170 are depicted as rolling bars in FIG. 14, rolling balls or other rolling components may also be adopted. Besides, although the rolling components 170 are both correspondingly disposed between the guide portions 230 and the tracks 140 of the display modules 200A and 200B as depicted in FIG. 14, when one of the display modules 200A and 200B, for example the display module 200A, is disposed to be fixed to the base 110, the disposition of the rolling components 170 between the display module 200A and the corresponding track 140 may also be omitted. Alternatively, when the display modules 200A and 200B are both disposed to be capable of generating a displacement, it is also possible that only one of them is disposed with the rolling components 170. In addition, although each guide portion 230 is corresponding to one rolling component 170 as depicted in FIG. 14, multiple rolling components 170 may be disposed actually. The disclosure does not limit the number, position and disposition of the rolling components 170. Besides, the rolling components 170 disposed on the inner side 112 of the base 110 adjacent to the track 140 may be also adjusted to the shape of the forementioned rolling components 160, and the disclosure is not limited thereto.

According to the embodiment of FIG. 9 and various variations of FIG. 10 to FIG. 14, at least one of the case 100 or display devices 200A and 200B adopted by the electronic device 300 provided by the disclosure may be disposed with the wear-resistant layer 150/wear-resistant surface or the rolling components 160 or 170 in the position on at least one of the display devices 200A and 200B corresponding to the track 140 (for example, the guide portion 230) according to demands, or the position on at least one of the display devices 200A and 200B corresponding to the working plane 400 (for example, the second end 224 of the bracket 220) is disposed with the rolling components 160, or the position on the track 140 corresponding to at least one of the display devices 200A and 200B (for example, the position corresponding to the guide portion 230) is disposed with the wear-resistant layer 150/wear-resistant surface or the rolling components 160 or 170, thereby facilitating the smooth sliding of the corresponding one of the display devices 200A and 200B on the track 140. However, the disclosure does not limit its implementation, and it can be adjusted according to demands.

Based on the above, the electronic device of the disclosure comprises a case and at least one display module, wherein the case is disposed with two connection ports and a track, and the at least one display module is adapted to be disposed on the case and electrically connected to a corresponding one of the two connection ports and slide on the track to generate a displacement, preferably a rotational displacement, in relative to the case. That is, the electronic device and the case of the disclosure can be configured with one or two display modules according to demands through the two connection ports, wherein the display module may perform display screen flipping or rotation through the pivoting structure to adjust the operating mode; and when the electronic device is disposed with two display modules, at least one of the display modules may also slide on the track according to demands, so that the display modules are in the operating mode of being back to each other, parallel to each other or perpendicular to each other. Thus, the electronic device and the case of the disclosure has various and convenient operating modes.

Although the disclosure has been disclosed with the above embodiments, it is not intended to limit the disclosure. Any person having ordinary skill in the art can make some changes and modifications without departing from the spirit and scope of the disclosure. Therefore, the protection scope of the disclosure shall be defined by the appended claims.

What is claimed is:

1. An electronic device, comprising:
   a host base, comprising:
      a base;
      a housing, disposed above the base and comprising an opening;
      two connection ports, disposed in the housing and corresponding to the opening; and
      a track, disposed on the edge of the base, wherein at least one end of the track is adjacent to the opening; and
   at least one display module, disposed on the host base and electrically connected to a corresponding one of the two connection ports, wherein the at least one display module comprises:
      a display screen;
      a bracket, comprising a first end and a second end opposite to each other, wherein the display screen is disposed on the first end; and
      a guide portion, disposed on the second end of the bracket, wherein the bracket is connected to the base with the second end corresponding to the opening, and the guide portion is slidably mounted on the track,
   wherein the at least one display module is adapted to slide on the track through the guide portion to generate a displacement in relative to the host base,
   wherein the number of the at least one display module is two, the two display modules are respectively connected to the base through the corresponding bracket with the second end corresponding to the opening, respectively electrically connected to a corresponding one of the two connection ports and respectively mounted on the track through the corresponding guide portion, and at least one of the display modules is adapted to slide on the track through the corresponding guide portion to generate a displacement in relative to the host base.

2. The electronic device according to claim 1, wherein the track is an arc-shaped track, and the at least one display module slides on the arc-shaped track through the guide portion to generate a rotational displacement in relative to the host base.

3. The electronic device according to claim 1, wherein the guide portion is in an arc shape, a cross section of the guide portion is in a cap shape and is slidably mounted on the track in a manner of covering the track.

4. The electronic device according to claim 1, wherein the bracket is detachably assembled to the guide portion through the second end.

5. The electronic device according to claim 1, wherein a surface on the track corresponding to the guide portion of the at least one display module is a wear-resistant surface, and the guide portion contacts the wear-resistant surface, so as to slide on the track.

6. The electronic device according to claim 1, wherein a surface on the guide portion corresponding to the track is a wear-resistant surface, and the wear-resistant surface of the guide portion contacts the track, so as to slide on the track.

7. The electronic device according to claim 1, wherein a surface on the track corresponding to the guide portion of the at least one display module is disposed with a plurality of rolling components in convex and side by side, and the guide portion contacts the rolling components, so as to slide on the track.

8. The electronic device according to claim 1, wherein a surface on the guide portion corresponding to the track is disposed with a plurality of rolling components in convex and side by side, and the guide portion contacts the track through the rolling components, so as to slide on the track.

9. The electronic device according to claim 1, wherein the second end of the bracket is disposed with a plurality of rolling components in convex and side by side, and the guide portion of the at least one display module contacts the track and contacts a working plane where the host base is located through the rolling components, so as to slide on the track.

10. The electronic device according to claim 1, wherein an inner side of the base adjacent to the track is disposed with a plurality of rolling components side by side, and the guide portion contacts the track and contacts the rolling components, so as to slide on the track.

11. The electronic device according to claim 1, wherein at least one of the display modules is fixed to a fixed position on the base.

12. The electronic device according to claim 1, wherein at least one of the display modules is detachably assembled to the host base.

13. The electronic device according to claim 1, wherein at least one of the display modules slides on the track through the corresponding guide portion to generate a displacement in relative to the host base, so that the display modules are in an operating mode of being back to each other, parallel to each other or perpendicular to each other.

14. The electronic device according to claim 1, wherein the at least one display module comprises a pivoting structure disposed between the first end of the bracket and the display screen, and the at least one display module is adapted to rotate in relative to the bracket and the host base through the pivoting structure.

15. The electronic device according to claim 14, wherein the pivoting structure comprises a rotating shaft and a rotary disk connected with each other, the rotating shaft extends along a long side direction of the display screen so that the display screen is adapted to flip in relative to the host base through the rotating shaft by using the long side direction as the axis, the rotary disk is used to rotate in relative to the bracket along a perpendicular direction of the display screen so that the display screen is adapted to rotate in relative to the host base through the rotary disk by using the perpendicular direction as the axis, and the perpendicular direction is perpendicular to the long side direction.

16. The electronic device according to claim 14, wherein the pivoting structure comprises a rotating shaft and a rotary disk connected with each other, and the rotating shaft extends along a short side direction of the display screen so that the display screen is adapted to flip in relative to the host base through the rotating shaft by using the short side direction as the axis.

17. The electronic device according to claim 14, wherein the display screen comprises two opposite short sides and two opposite long sides, and the pivoting structure is disposed at a position at one third of the length of the long side from one of the two short sides and one half of the length of the short side from one of the two long sides in the display screen.

18. The electronic device according to claim 1, wherein the at least one display module comprises at least one docking port disposed on at least one edge of the display screen.

19. A host base, comprising:
a base;
a housing, disposed above the base and comprising an opening;
two connection ports, disposed in the housing and corresponding to the opening; and
a track, disposed on the edge of the base, wherein at least one end of the track is adjacent to the opening,
wherein at least one display module is disposed on the host base and electrically connected to a corresponding one of the two connection ports, the at least one display module comprises a display screen and a bracket, the display screen is disposed on a first end of the bracket, the bracket is connected to the base with a second end of the bracket corresponding to the opening, and the at least one display module is adapted to slide on the track to generate a displacement in relative to the host base;
wherein the number of the at least one display module is two, the two display modules are respectively connected to the base through a corresponding bracket corresponding to the opening, respectively electrically connected to a corresponding one of the two connection ports and respectively mounted on the track through a corresponding guide portion, and at least one of the display modules is adapted to slide on the track through the corresponding guide portion so as to generate a displacement in relative to the host base.

20. The host base according to claim 19, wherein the track is an arc-shaped track, and the at least one display module is adapted to slide on the arc-shaped track to generate a rotational displacement in relative to the host base.

21. The host base according to claim 19, wherein a surface on the track corresponding to a guide portion of the at least one display module is a wear-resistant surface, and the guide portion contacts the wear-resistant surface, so as to slide on the track.

22. The host base according to claim 19, wherein a surface on the track corresponding to a guide portion of the at least one display module is disposed with a plurality of rolling components in convex and side by side, and the guide portion contacts the rolling components, so as to slide on the track.

23. The host base according to claim 19, wherein an inner side of the base adjacent to the track is disposed with a plurality of rolling components side by side, and a guide portion of the at least one display module contacts the track and contacts the rolling components, so as to slide on the track.

* * * * *